(12) United States Patent
deVilliers et al.

(10) Patent No.: US 10,083,842 B2
(45) Date of Patent: Sep. 25, 2018

(54) METHODS OF SUB-RESOLUTION SUBSTRATE PATTERNING

(71) Applicant: Tokyo Electron Limited, Minato-ku, Tokyo (JP)

(72) Inventors: Anton J. deVilliers, Clifton Park, NY (US); Nihar Mohanty, Clifton Park, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/815,374

(22) Filed: Nov. 16, 2017

(65) Prior Publication Data

US 2018/0138051 A1    May 17, 2018

Related U.S. Application Data

(60) Provisional application No. 62/422,840, filed on Nov. 16, 2016.

(51) Int. Cl.
*H01L 21/3213* (2006.01)
*H01L 21/02* (2006.01)
*B82Y 40/00* (2011.01)

(52) U.S. Cl.
CPC .... *H01L 21/3213* (2013.01); *H01L 21/02019* (2013.01); *B82Y 40/00* (2013.01)

(58) Field of Classification Search
CPC .......... H01L 21/3213; H01L 21/02019; B82Y 40/00
See application file for complete search history.

(56) References Cited

U.S. PATENT DOCUMENTS

| | | |
|---|---|---|
| 2011/0070739 A1 | 3/2011 | Cheng et al. |
| 2015/0243518 A1 | 8/2015 | deVilliers |
| 2015/0371852 A1 | 12/2015 | Zhang et al. |
| 2016/0111336 A1 | 4/2016 | Chang et al. |
| 2016/0172237 A1* | 6/2016 | Bristol ............... H01L 21/0271 257/773 |
| 2016/0203993 A1* | 7/2016 | Zhou .................. H01L 21/0337 438/692 |
| 2016/0254161 A1* | 9/2016 | Chan .................. H01L 21/3081 438/702 |

FOREIGN PATENT DOCUMENTS

KR    10-2011-0024587 A    3/2011

OTHER PUBLICATIONS

PCT International Search Report of International application No. PCT/US2017/062053, dated Feb. 19, 2018, Korean Intellectual Property Office, Korea.

* cited by examiner

*Primary Examiner* — Duy Vu N Deo

(57) ABSTRACT

Techniques disclosed herein provide a method for substrate patterning that results in lines of non-uniform pitch (mixed pitch). Techniques can also enable advanced patterning options by selectively replacing lines of material in a multi-line layer. A multi-line layer is formed that has alternating lines of three different materials. One or more etch masks are used to selectively remove at least one uncovered line without removing other uncovered lines. Removed material is replaced with a fill material. Selective removal is executed using an etch mask as well as differing etch resistivities of the different lines of materials.

17 Claims, 11 Drawing Sheets

METHODS OF SUB-RESOLUTION SUBSTRATE PATTERNING

CROSS REFERENCE TO RELATED APPLICATIONS

The present application claims the benefit of U.S. Provisional Patent Application No. 62/422,840, filed on Nov. 16, 2016, entitled "Method of Patterning for Back End of Line Trench," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure to actinic radiation through a reticle (and associated optics) onto the radiation-sensitive material using, for example, a photo-lithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

Semiconductor technologies are continually progressing to smaller feature sizes or nodes including feature sizes of 14 nanometers, 7 nm, 5 nm, and below. This continual reduction in sizes of features from which various elements are fabricated places ever-greater demands on techniques used to form the features. The concept of "pitch" can be used to describe the sizing of these features. Pitch is the distance between two identical points in two adjacent repetitive features. Half-pitch then is half the distance between identical features of adjacent features.

Pitch reduction techniques are termed (often somewhat erroneously yet routinely) "pitch multiplication" as exemplified by "pitch doubling" et cetera. Pitch reduction techniques can extend the capabilities of photolithography beyond feature size limitations (optical resolution limitations). That is, conventional multiplication of pitch (more accurately pitch reduction, or multiplication of pitch density) by a certain factor involves reducing a target pitch by a specified factor. Double patterning techniques used with 193 nm immersion lithography are conventionally considered as one of the most promising techniques to pattern 22 nm nodes and smaller. Noteworthy is that self-aligned spacer double patterning (SADP) has already been established as a pitch density doubling process and has been adapted in high volume manufacturing of NAND flash memory devices. Moreover, ultra-fine resolution can be obtained to repeat the SADP step twice as pitch quadrupling.

Although there exist several patterning techniques to increase pattern density or pitch density, conventional patterning techniques suffer from poor resolution or rough surfaces of etched features. Thus, conventional techniques cannot provide a level of uniformity and fidelity desired for very small dimensions (20 nm and smaller). Reliable lithographic techniques can produce features having a pitch of about 80 nm. Conventional and emerging design specifications, however, desire to fabricate features having critical dimensions less than about 20 nm or 10 nm. Moreover, with pitch density doubling and quadrupling techniques, sub-resolution lines can be created, but making cuts or connections between these lines is challenging, especially since the pitch and dimensions needed for such cuts is far below capabilities of conventional photo-lithography systems.

Techniques disclosed herein provide a method for substrate patterning that results in lines of non-uniform pitch (mixed pitch). Techniques herein can also enable advanced patterning options by selectively replacing lines of material in a multi-line layer.

One embodiment includes a method of patterning a substrate. A multi-line layer is formed on an underlying layer of a substrate. The multi-line layer includes a region having a pattern of alternating lines of a first material, a second material, and a third material. Each line has a horizontal thickness, a vertical height, and extends horizontally across the underlying layer. Each line of the pattern of alternating lines extends vertically from a top surface of the multi-line layer to a bottom surface of the multi-line layer. A first etch mask is formed on the multi-line layer that uncovers a portion of the pattern of alternating lines. Portions of the first material of the multi-line layer that are uncovered by the first etch mask are removed. Removed portions of the first material are replaced with a fill material that extends vertically from a top surface of the multi-line layer to a bottom surface of the multi-line layer. The first etch mask is removed resulting in the multi-line layer having four different materials. This process can be repeated to replace other portions of the same or different lines in the multi-line layer.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein provide a method for substrate patterning that results in lines of non-uniform pitch, sometimes referred to as mixed pitch. Techniques herein can also enable advanced patterning options by selectively replacing lines of material in a multi-line layer. A multi-line layer is formed that has alternating lines of three different materials. One or more etch masks are used to selectively remove at least one uncovered line without removing other uncovered lines. Removed material is replaced with a fill material. Selective removal is executed using an etch mask as well as differing etch resistivities of the different lines of materials.

Figure 1A:
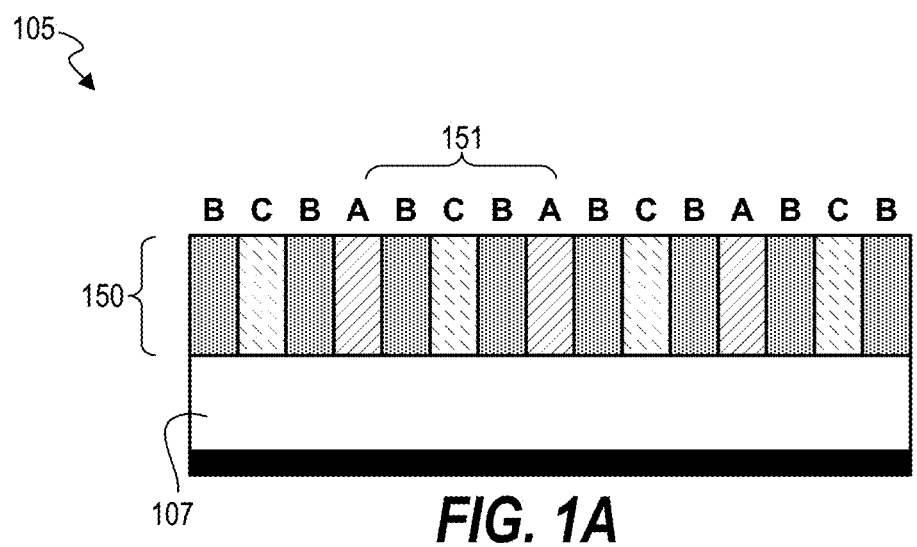
FIG. 1A is a cross-sectional side view.
Figure 1B:
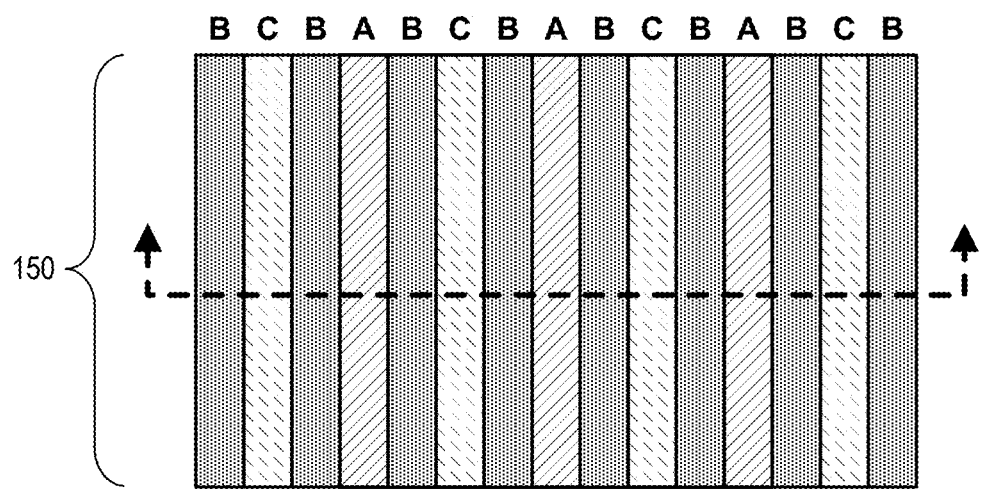
FIG. 1B is a top view, of an example substrate segment according to embodiments disclosed herein.

One embodiment includes a method of patterning a substrate. The method includes forming a multi-line layer on (above) an underlying layer of a substrate. FIGS. 1A and 1B illustrate an example multi-line layer 150 on substrate 105. The multi-line layer can be formed directly on the underlying layer 107, or on any intervening layer or interfacial films or planarization layers, such as on an anti-reflective coating (ARC) layer. The multi-line layer includes a region having a pattern of alternating lines of a first material, a second material, and a third material. Each line has a horizontal thickness, a vertical height, and extends horizontally across the underlying layer. Each line of the pattern of alternating lines extends vertically from a top surface of the multi-line layer to a bottom surface of the multi-line layer 150. In other words, lines alternate in a horizontal direction across a working surface of the substrate and are accessible from a top surface to a bottom surface for full etch removal of the lines.

In some embodiments the alternating lines can cover essentially an entire surface of a substrate, but in other alternative embodiments only particular regions have the pattern of alternating lines. Note that the alternating lines can include straight lines, curved lines, race track path lines, et cetera. Another example of alternating lines is a set of concentric circles with each ring being a curved line. In other words, each line of a particular material can be anisotropically etched (removed) to a bottom surface of the multi-line layer thereby uncovering underlying layers because lines of materials alternate horizontally across a substrate surface in contrast to a vertical stack of materials. At least two of the three materials differ chemically from each other by having different etch resistivities relative to each other for one or more particular etchants.

Having different etch resistivities from each other, as used herein, means that there is at least one etchant (or etchant combination) that etches a given one material at a greater rate than the other material(s). Note that there can exist particular etchants that etch two or more given materials at a same rate, but there is at least one etchant that etches an included material faster relative to the other materials. Etching one material relative to another can include etching one material without substantially etching the other, or etching one material at a substantially greater rate as compared to the other material such as having an etch rate ratio of 3:1, 4:1, 10:1, et cetera. For two materials to have different etch resistivities this typically means that two materials are chemically different from each other such as by particular atomic elements included or arrangement of atomic elements. Two materials that are largely the same, except that one of the two materials includes a dopant, can nevertheless have different etch resistivities. Moreover, materials having the same atomic elements but with differing molecular or crystal structures can provide an etch resistivity differential also.

FIGS. 1A and 1B illustrate example results of forming a particular multi-line layer. The first material, the second material, and the third material can correspond to lines "A," "B," and "C." Note that bracket 151 shows a particular pattern segment of alternating lines. This pattern follows a sequence of A-B-C-B, which is then repeated. Thus, this pattern can continue with the sequence of A-B-C-B-A-B-C-B-A-B-C-B-A and so on. In other embodiments, an alternating pattern of A-B-A-B is used and then one of the two materials is selectively replaced with a third material. Note that in this particular multi-line layer material A can be isolated from being in contact with material C by having lines of material B on both sides of material A. In other embodiments, the half pitch of a given material can be varied so that material C can be absent in some regions or larger in other regions. The multi-line layer 150 can be formed by first forming mandrels, which can be material A. The sidewall spacers are formed using the mandrels as material B. Sidewall spacers can be formed by conformal deposition of material B followed by spacer etch back to leave deposits only on sidewalls of mandrels. Material C or the third material can be deposited as a spin-on material or over-coated material and then recessed to top surfaces of the mandrels by etch back, acid diffusion and development, or otherwise planarized to remove excess material.

Note that many different materials can be used. By way of a non-limiting example, the underlying layer 107 can be silicon nitride. This can be a memorization layer, target layer, or temporary layer such as to help transfer into another underlying layer, such as a metal hard mask. The mandrels A can be a silicon material such amorphous silicon. Spacers B can be silicon oxide. Material C can be metal oxide such as titanium oxide (TiOx). As is conventionally known, various other material combinations can be used that provide differential etch resistivities to be able to selectively etch one or more materials without etching remaining materials.

Figure 2A:
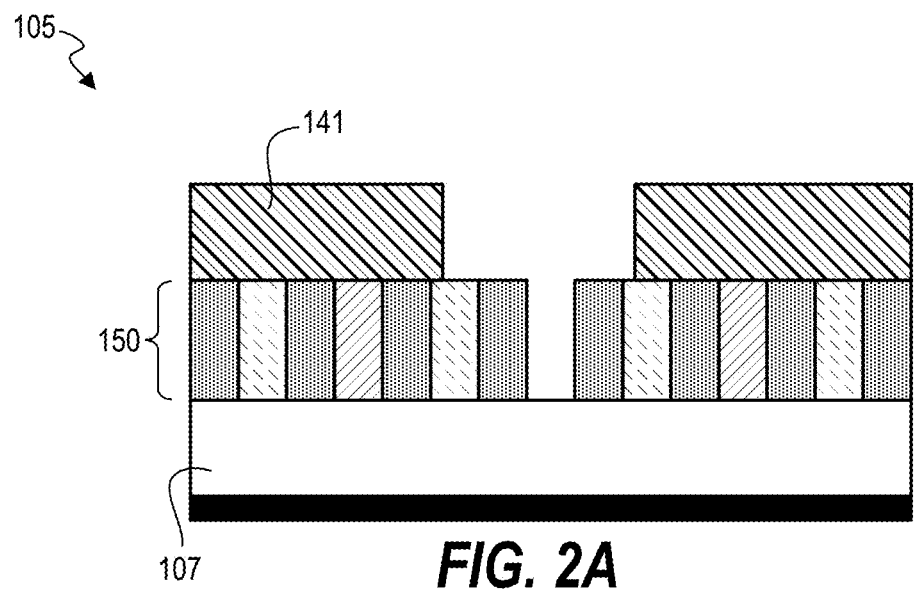
FIG. 2A is a cross-sectional side view.
Figure 2B:
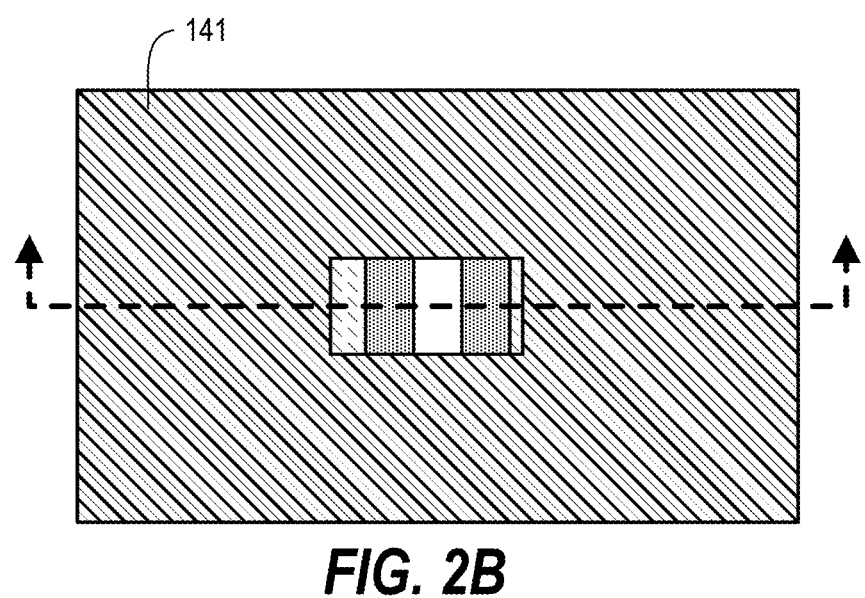
FIG. 2B is a top view, of an example substrate segment according to embodiments disclosed herein.

Referring now to FIGS. 2A and 2B, a first etch mask is formed on the multi-line layer such as etch mask 141. This first etch mask uncovers a portion of the pattern of alternating lines. For simplicity, etch mask 141 is shown directly on multi-line layer 150. Note, however, that additional layers can be used for photolithographic pattering such as an organic planarization layer, an anti-reflective coating, and then the etch mask 141 can be comprised of photoresist. Portions of the first material of the multi-line layer that are uncovered by the first etch mask are then removed. Such removal can be executed via anisotropic etch. FIGS. 2A and 2B show the substrate 105 with etch mask 141 and with material A having been removed, that is, uncovered portions (non-masked portions) of material A having been removed.

Figure 3A:
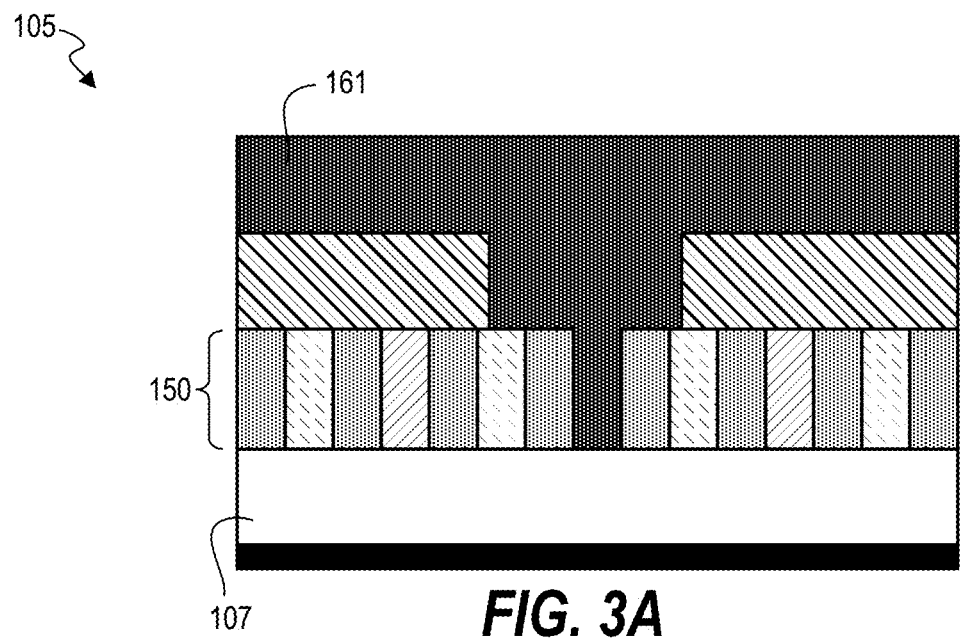
FIG. 3A is a cross-sectional side view.
Figure 3B:
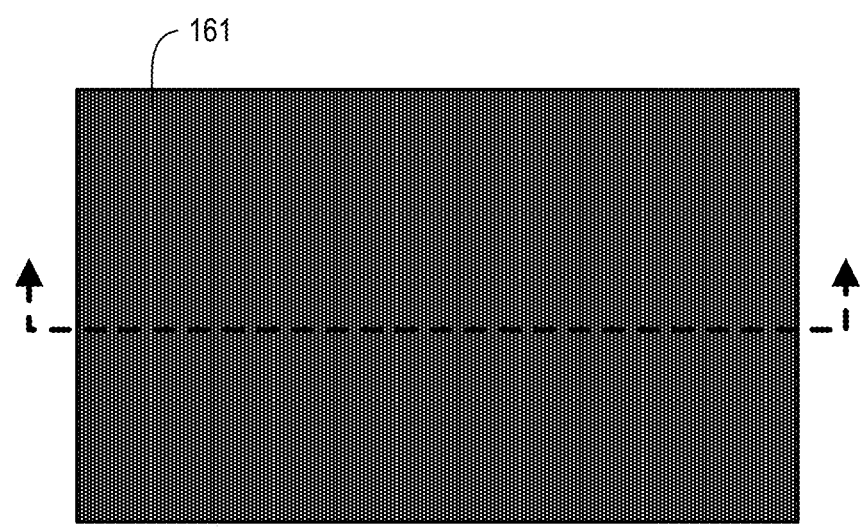
FIG. 3B is a top view, of an example substrate segment according to embodiments disclosed herein.

Removed portions of the first material are then replaced with a fill material that extends vertically from a top surface of the multi-line layer to a bottom surface of the multi-line layer. Such removal and replacement can have two or more process steps. In some embodiments, selective deposition can be executed that selectively deposits on uncovered portions of underlying layer 107 without being deposited on other materials of the multi-line layer. In other embodiments, material 161 is deposited on the substrate 105 such as by spin-on deposition. Such spin-on deposition typically results in an over coat or over burden of material. FIGS. 3A and 3B show material 161 filling removed portions of the first material, but also covering the etch mask 141.

Figure 4A:
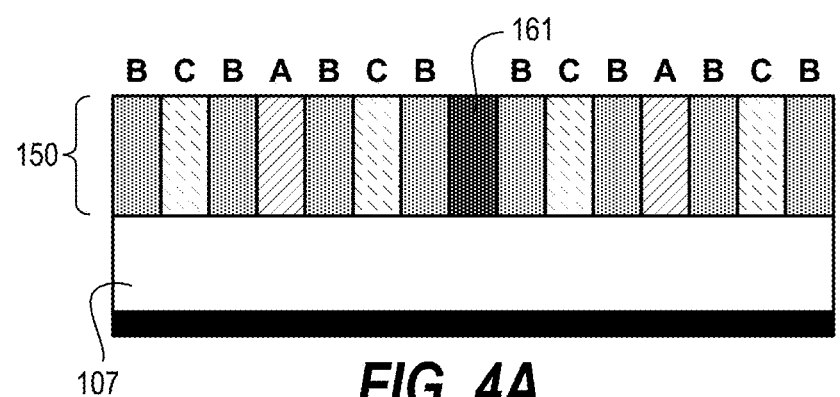
FIG. 4A is a cross-sectional side view.
Figure 4B:
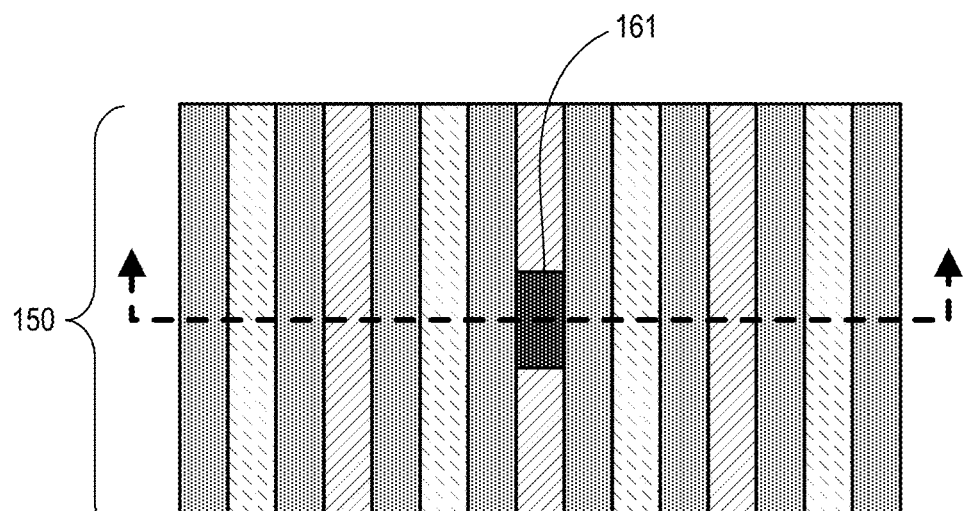
FIG. 4B is a top view, of an example substrate segment according to embodiments disclosed herein.

The first etch mask is then removed resulting in the multi-line layer having four different materials. An example result is illustrated in FIGS. 4A and 4B. Such removal can be executed by etch back or chemical-mechanical polishing or other planarization technique. Note that the multi-line layer 150 now can have four different materials. Note that the fill material can be a different material from the other lines in the multi-line layer, or can be a same material as one of the other lines, such as a same material as lines B. Choice of material can be based on design objectives of a particular patterning flow.

Figure 5A:
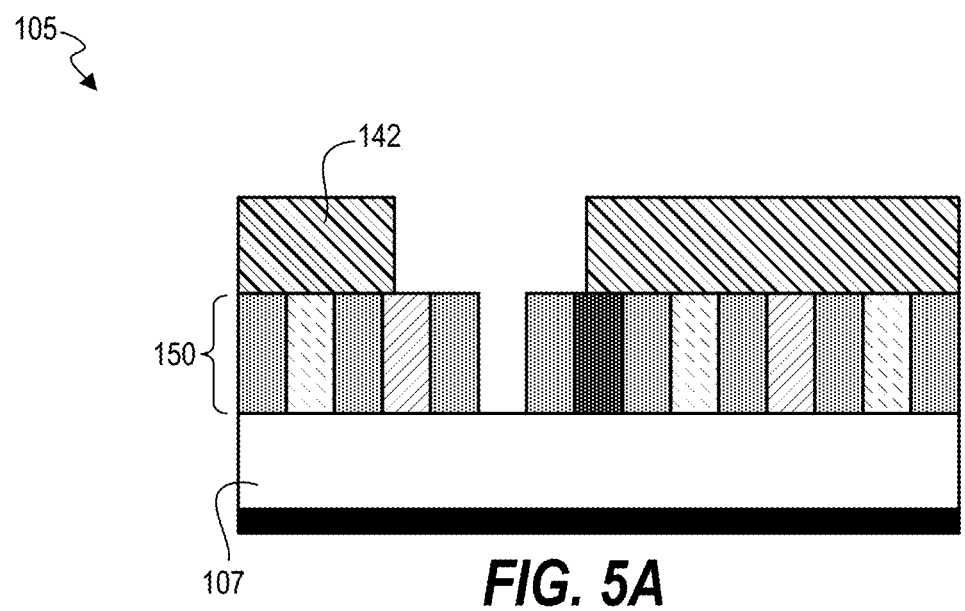
FIG. 5A is a cross-sectional side view.
Figure 5B:
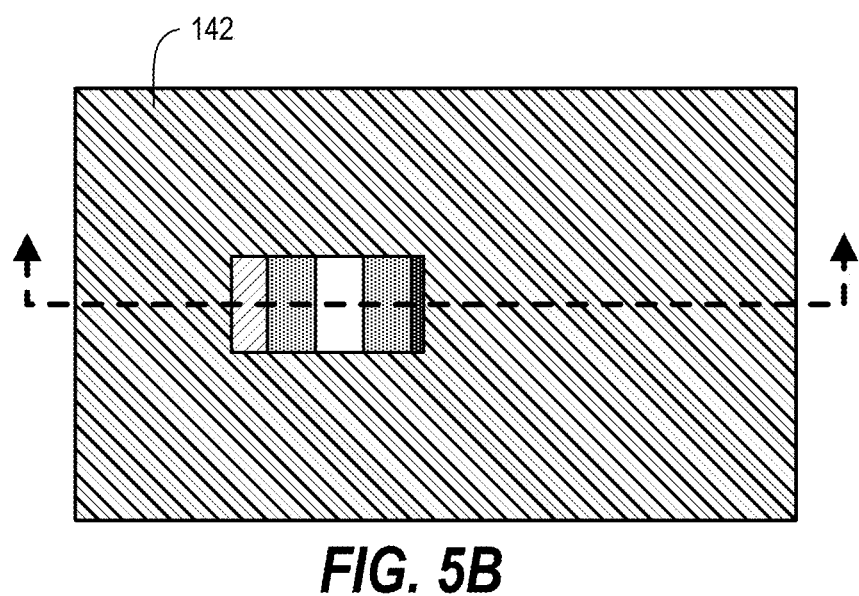
FIG. 5B is a top view, of an example substrate segment according to embodiments disclosed herein.

Referring now to FIGS. 5A and 5B, a second etch mask, such as etch mask 142, is formed on the multi-line layer 150 that uncovers a second portion of the pattern of alternating lines. Portions of the third material of the multi-line layer that are uncovered by the second etch mask are then removed. FIGS. 5A and 5B show a portion of material C having been removed. Mask formation and material removal can be executed as previously described.

Figure 6A:
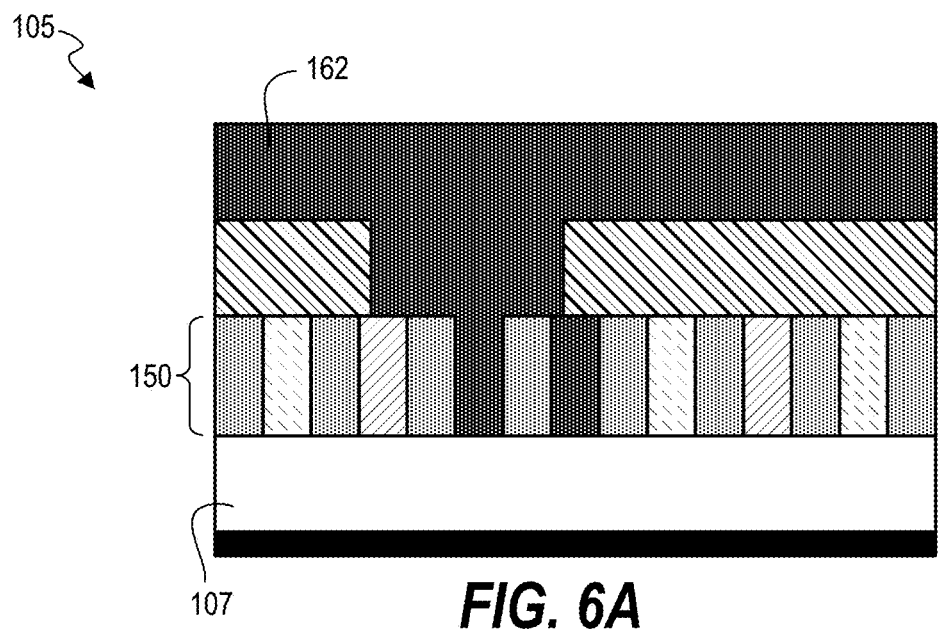
FIG. 6A is a cross-sectional side view.
Figure 6B:
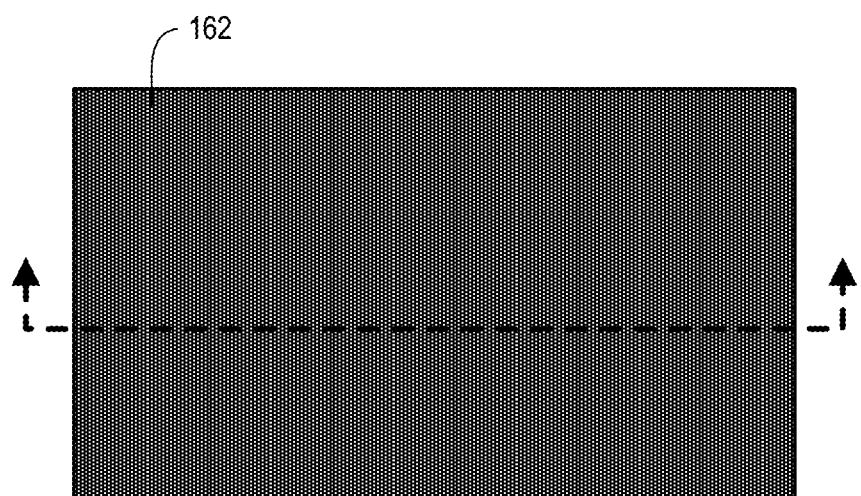
FIG. 6B is a top view, of an example substrate segment according to embodiments disclosed herein.

Removed portions of the third material are then replaced with a fill material that extends vertically from a top surface of the multi-line layer to a bottom surface of the multi-line layer. Such removal and replacement can be executed as previously described. For example, material 162 can be over coated on the substrate 105, and then planarized or otherwise recessed to a top surface of multi-line layer 150. FIGS. 6A and 6B show material 162 filling removed portions of the third material, but also covering the etch mask 142.

Figure 7A:
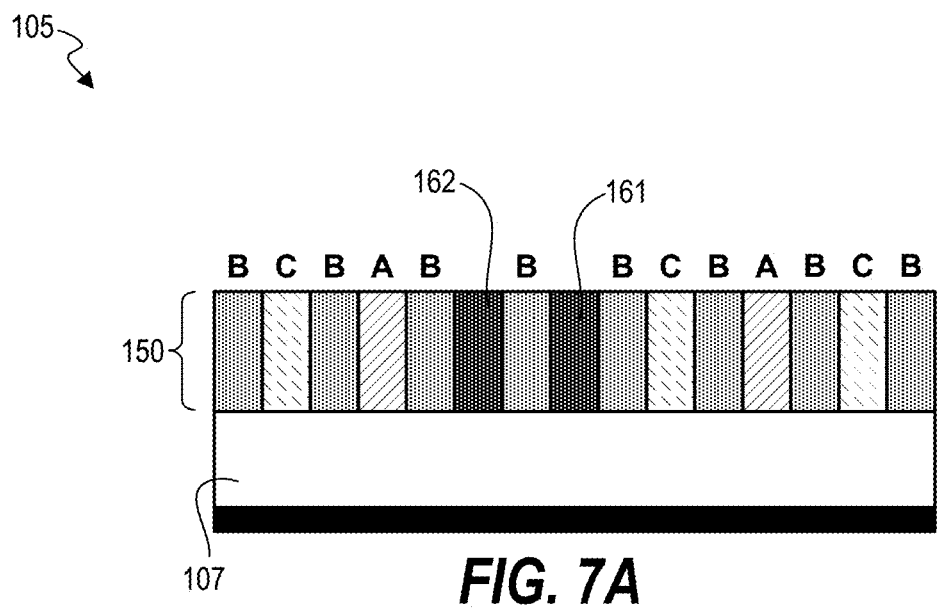
FIG. 7A is a cross-sectional side view.
Figure 7B:
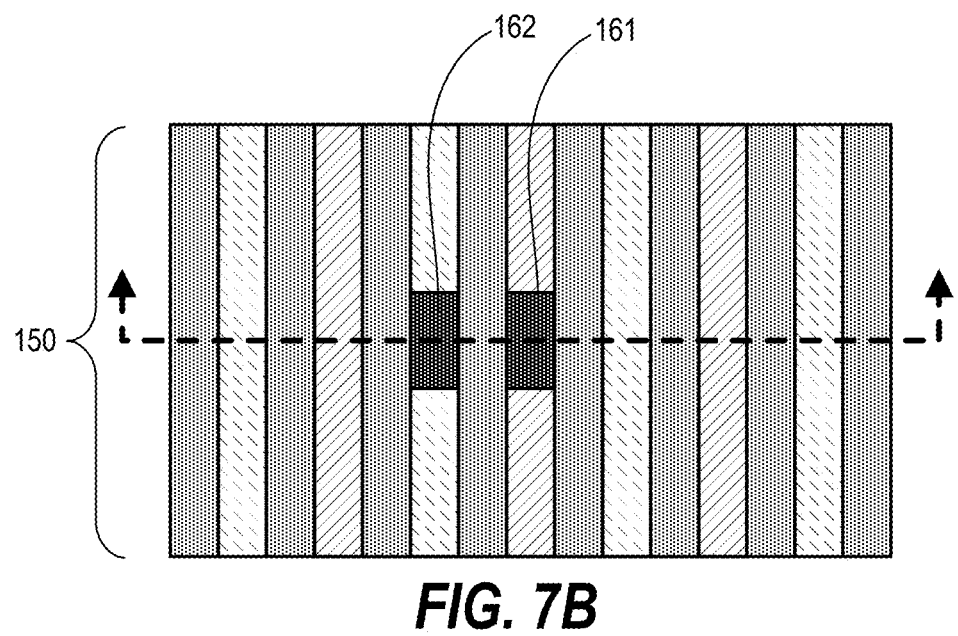
FIG. 7B is a top view, of an example substrate segment according to embodiments disclosed herein.

The second etch mask is then removed resulting in the multi-line layer having four or more different materials. An example result is illustrated in FIGS. 7A and 7B. Such removal can be executed by etch back or chemical-mechanical polishing or other planarization technique. Note that the multi-line layer 150 now can have four different materials. Note that the fill material can be a different material from the other lines in the multi-line layer, or can be a same material as one of the other lines, such as a same material as lines B. Material 161 and 162 can be identical if desired.

This process of location-specific removal and replacement of lines or portions of lines of material can be repeated. Accordingly, techniques herein provide a customized multi-line layer for use with any self-aligned block technique. Location-specific or custom injection of a new material into the multi-line layer can provide advanced patterning benefits. Lines of uniform pitch are easier to print at resolution with conventional photolithography technology. Mixed pitch or non-uniform pitch is desired, however, for many electronic designs. With techniques herein, mixed-pitch patterns can be created by first forming alternating lines of uniform pitch, followed by location-specific removal and replacement of particular lines or line segments of a multi-line layer. After an initial multi-line layer has been modified by selective removal and replacement of lines with a different material, then the multi-line layer itself can be used as an etch mask for transfer into an underlying layer, or additional etch masks can be formed on/above the modified multi-line layer for etching selected areas of the modified multi-line layer.

Figure 8A:
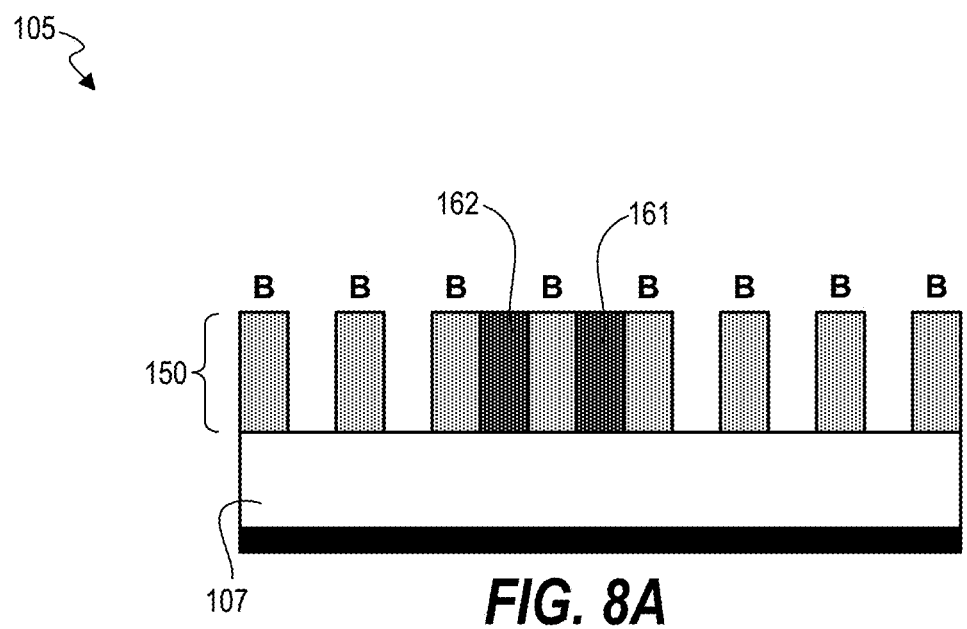
FIG. 8A is a cross-sectional side view.
Figure 8B:
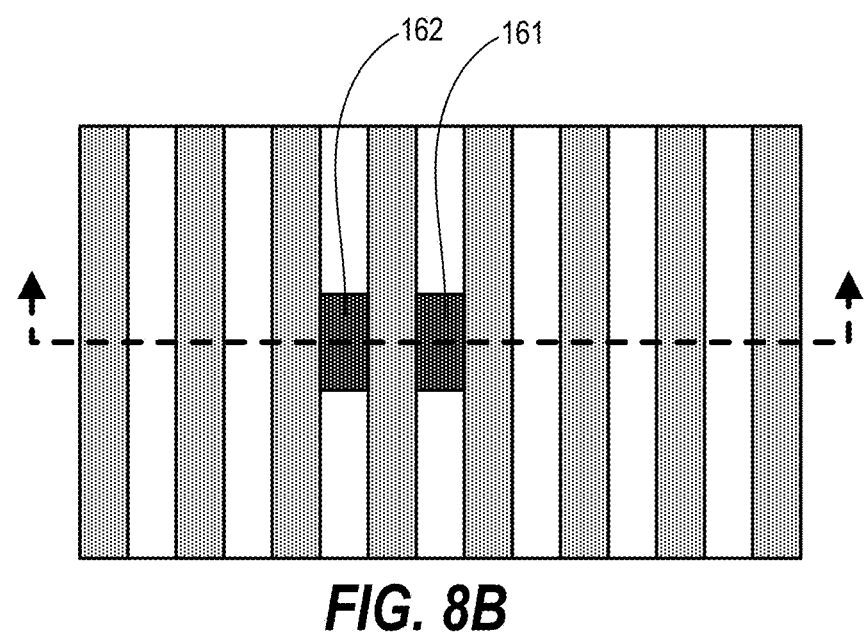
FIG. 8B is a top view, of an example substrate segment according to embodiments disclosed herein.
Figure 9A:
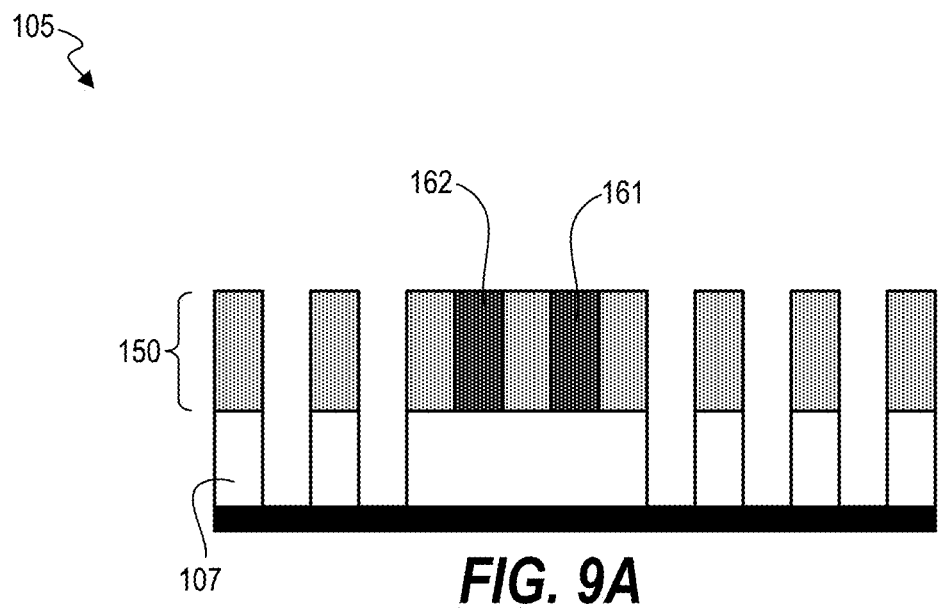
FIG. 9A is a cross-sectional side view.
Figure 9B:
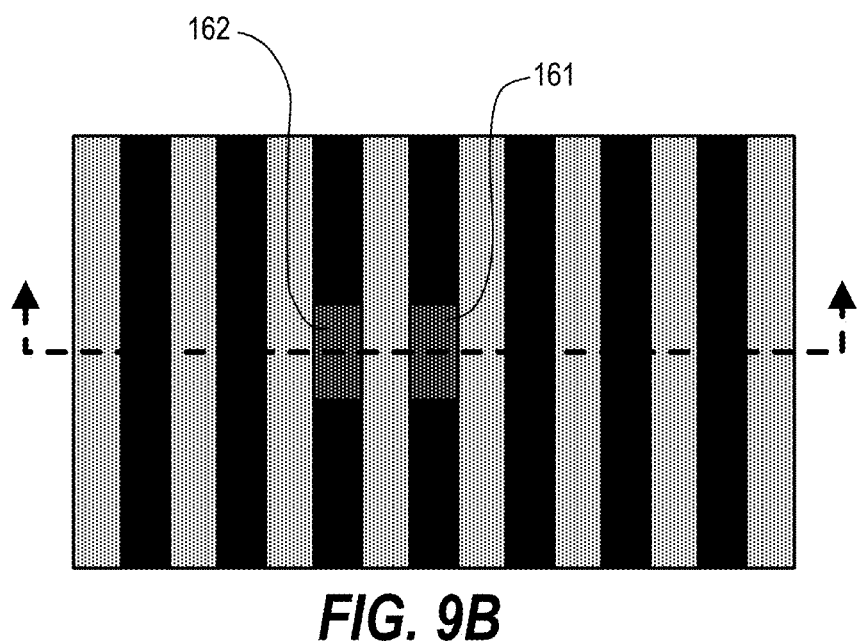
FIG. 9B is a top view, of an example substrate segment according to embodiments disclosed herein.
Figure 10A:
FIG. 10A is a cross-sectional side view.
Figure 10B:
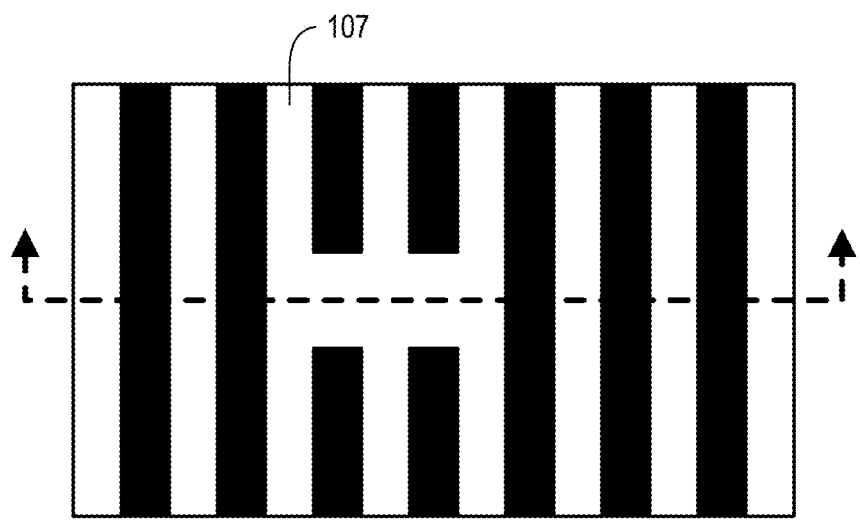
FIG. 10B is a top view, of an example substrate segment according to embodiments disclosed herein.
Figure 11A:
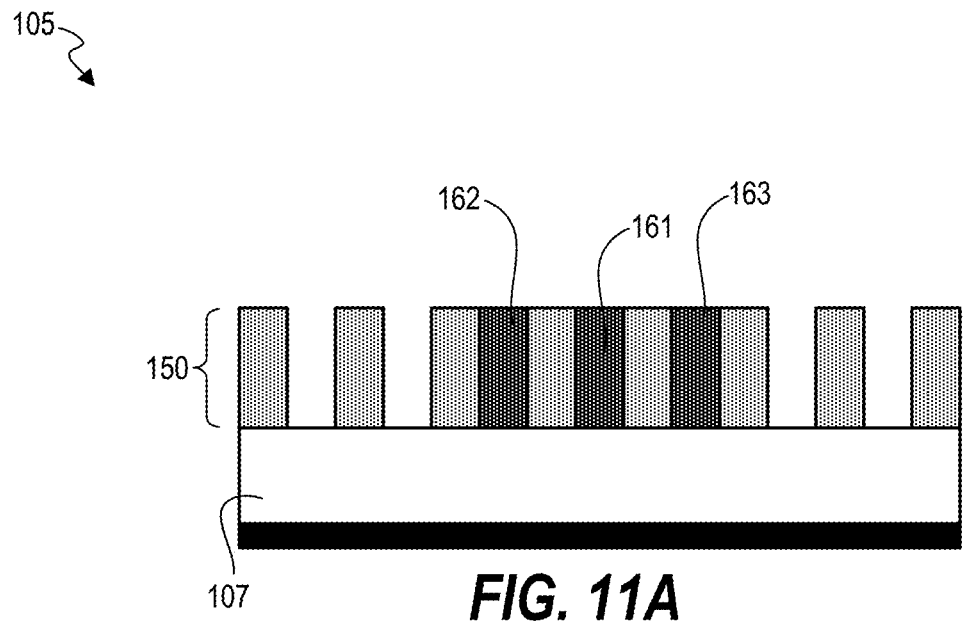
FIG. 11A is a cross-sectional side view.
Figure 11B:
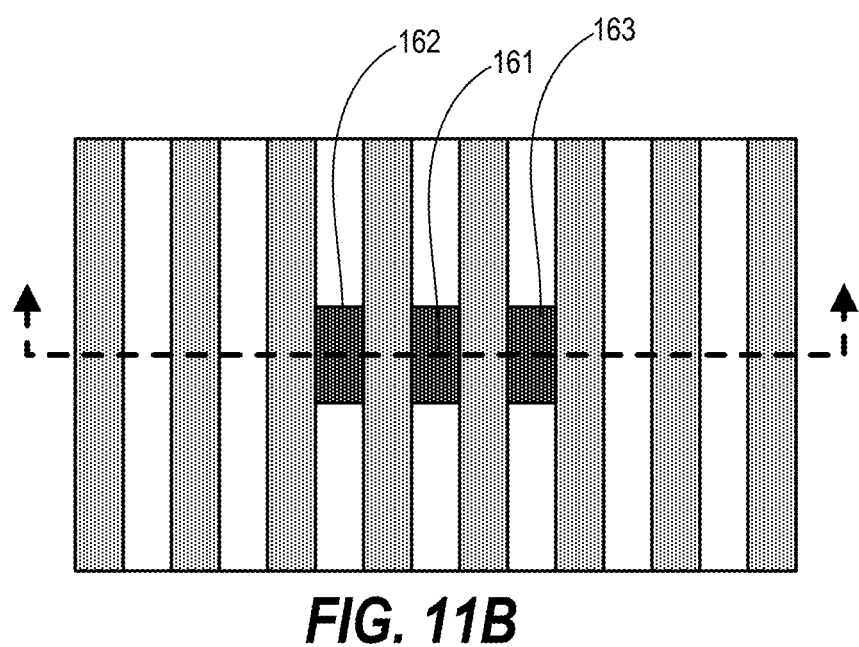
FIG. 11B is a top view, of an example substrate segment according to embodiments disclosed herein.

FIGS. 8A and 8B show a modified multi-line layer after removal of lines of the first material and the third material. What remains on the substrate then is lines of the second material as well as replacement material. The remaining material of the multi-line layer can then be used to transfer into underlying layer 107, as shown in FIGS. 9A and 9B. FIGS. 10A and 10B show the multi-line layer having been removed. The result is a pattern of lines of the second material plus additional plugs. Note that entire lines or segments of lines can be replaced to create areas of mixed pitch lines. For example, in some areas all of line A can be removed and replaced with material B, resulting in mixed pitch of remaining lines of material A. Note also that the steps of removal and replacement can be executed any number of times. FIGS. 11A and 11B illustrate a multi-line layer with three replacement steps to create a larger blocked area that includes fill 163.

Accordingly, in other embodiments, a third etch mask can be formed on the multi-line layer that uncovers a third portion of the pattern of alternating lines. Portions of the first material (or second material or third material) of the multi-line layer that are uncovered by the third etch mask are removed. The removed portions can then be replaced. Thus, any combination of etch masks and lines of material can be selectively removed and replaced. Moreover, after forming a modified multi-line layer, any number of additional etch masks can be formed thereon for combined transfer into one or more underlying layers. For example, after a modified multi-line layer is formed, an etch mask can be formed thereon that uncovers portions of the modified multi-line layer. One or more materials in the modified multi-line layer can then be selectively removed. The etch mask on the modified multi-line layer together with the modified multi-line layer itself (having one or more materials removed) then forms a combined etch mask. This combined etch mask can then be used to transfer into an underlying layer, such as a memorization layer, target layer, hard mask, et cetera.

As can be appreciated, there are many different pattering applications for embodiments herein, such as with front-end-of-line (FEOL), back-end-of-line (BEOL), memory arrays, logic, three-dimensional patterning and so forth. For example, as part of semiconductor fabrication, various relief patterns need adjustments. These adjustments can be made with a pillar mask(s) or a cut/hole mask(s) depending on the application. Block masks typically leave relatively small islands, mesas, or pillars on a substrate to block a relatively small portion of a relief pattern from being etch transferred into one or more underlying layers. In contrast, cut or hole masks typically cover most of a substrate surface and have relatively small openings at specific locations to make location-precise etches such as to remove a segment of a line or make a cut in that line or make a via or contact opening.

One challenge with using block masks or pillar masks is that of pattern collapse. With increased scaling, portions of a pattern that need to be blocked for pattern transfer become increasingly smaller in dimensions. This makes it challenging, for example, to make blocks for narrow pitch back end of line (BEOL) trench patterning, such as for metallization. Techniques herein, however use customized self-aligned block masks so that un-manageable overlay requirements are traded off for etch selectivity challenges. A self-aligned block mask (multi-line layer) is selectively modified in lines of material as a tone reversal patterning technique instead of using a pillar mask initially.

Critical dimensions (CDs) of pillar masks in block patterning are being reduced to about 1.5 times the half pitch. At sub-30 nm pitches, this results in sub 22.5 nm CD for pillars. Such small pillars have a significant potential to collapse or flop-over, which will result in device defects. Techniques herein use a self-aligned block process with spin-on metal oxide (MeOx) or another material with differing etch resistivity to other patterning materials. A given pillar mask is thus replaced with a hole mask, which is structurally better and essentially provides higher flop-over and printability margin. Furthermore, CD control is easily controlled by etch shrink for hole mask as compared with trim techniques for pillar mask shrinking. Accordingly, techniques herein can use two spin-on materials for the fourth color material and the tone reversal material, respectively. One example tone reversal material is spin-on glass (SOG).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
   forming a multi-line layer on an underlying layer of a substrate, the multi-line layer including a region having a pattern of alternating lines of a first material, a second material, and a third material, wherein each line has a horizontal thickness, a vertical height, and extends horizontally across the underlying layer, wherein each line of the pattern of alternating lines extends vertically from a top surface of the multi-line layer to a bottom surface of the multi-line layer;
   forming a first etch mask on the multi-line layer that uncovers a portion of the pattern of alternating lines;
   removing portions of the first material of the multi-line layer that are uncovered by the first etch mask;
   replacing removed portions of the first material with a fill material that extends vertically from the top surface of the multi-line layer to the bottom surface of the multi-line layer; and
   removing the first etch mask resulting in the multi-line layer having four different materials.

2. The method of claim 1, wherein removing the first material of the multi-line layer that is uncovered by the first etch mask includes executing a first etch process that etches the first material of the multi-line layer that is uncovered while uncovered portions of the second material and the third material of the multi-line layer remain on the substrate.

3. The method of claim 1, wherein replacing removed portions the first material with the fill material includes:
   depositing the fill material on the substrate resulting in the fill material initially covering the first etch mask and the multi-line layer; and
   planarizing the substrate resulting in the first etch mask being removed and the fill material above the top surface of the multi-line layer being removed.

4. The method of claim 1, further comprising:
forming a second etch mask on the multi-line layer that uncovers a second portion of the pattern of alternating lines;
removing portions of the third material of the multi-line layer that are uncovered by the second etch mask; and
replacing removed portions of the third material with the fill material that extends vertically from the top surface of the multi-line layer to the bottom surface of the multi-line layer.

5. The method of claim 4, further comprising:
forming a third etch mask on the multi-line layer that uncovers a third portion of the pattern of alternating lines;
removing portions of the first material of the multi-line layer that are uncovered by the third etch mask; and
replacing removed portions of the first material with the fill material that extends vertically from the top surface of the multi-line layer to the bottom surface of the multi-line layer.

6. The method of claim 4, further comprising:
forming a third etch mask on the multi-line layer that uncovers a third portion of the pattern of alternating lines;
removing portions of the second material of the multi-line layer that are uncovered by the third etch mask; and
replacing removed portions of the second material with the fill material that extends vertically from the top surface of the multi-line layer to the bottom surface of the multi-line layer.

7. The method of claim 1, wherein the first material, the second material, and the third material different chemically from each other by having different etch resistivities for a particular etchant.

8. The method of claim 1, further comprising:
removing portions of the third material of the multi-line layer that are uncovered by the first etch mask;
replacing removed portions of the third material with the fill material that extends vertically from the top surface of the multi-line layer to the bottom surface of the multi-line layer.

9. The method of claim 1, wherein the pattern of alternating lines of the first material, the second material, and the third material forming a repeating sequence of A-B-C-B-A-B-C-B in which material A and material B and material C have different etch resistivities relative to each other for a particular etchant.

10. The method of claim 9, wherein the second material is formed as sidewall spacers.

11. The method of claim 1, further comprising:
removing the first material from the multi-line layer; and
transferring a pattern defined by remaining materials of the multi-line layer into the underlying layer.

12. The method of claim 11, further comprising:
forming a fourth etch mask on the multi-line layer, and using the fourth etch mask and remaining materials of the multi-line layer as a combined etch mask when etching into the underlying layer.

13. The method of claim 1, further comprising:
removing the first material from the multi-line layer;
removing the third material from the multi-line layer; and
transferring a pattern defined by remaining materials of the multi-line layer into the underlying layer.

14. The method of claim 13, further comprising:
forming a fourth etch mask on the multi-line layer, and using the fourth etch mask and remaining materials of the multi-line layer as a combined etch mask when etching into the underlying layer.

15. The method of claim 1, wherein a pitch of a given line of material in the multi-line layer is less than 40 nanometers.

16. The method of claim 1, wherein a half pitch of a given line of material in the multi-line layer is less than 16 nanometers.

17. The method of claim 1, wherein the multi-line layer results in a relief pattern defining lines having a non-uniform pitch.

* * * * *